United States Patent
Blomme et al.

(10) Patent No.: US 9,972,386 B2
(45) Date of Patent: May 15, 2018

(54) STACKED RRAM ARRAY WITH INTEGRATED TRANSISTOR SELECTOR

(71) Applicant: IMEC, Leuven (BE)

(72) Inventors: Pieter Blomme, Heverlee (BE); Dirk Wouters, Leuven (BE)

(73) Assignee: IMEC, Leuven (BE)

( * ) Notice: Subject to any disclaimer, the term of this patent is extended or adjusted under 35 U.S.C. 154(b) by 0 days. days.

(21) Appl. No.: 13/723,164

(22) Filed: Dec. 20, 2012

(65) Prior Publication Data
US 2013/0161583 A1    Jun. 27, 2013

(30) Foreign Application Priority Data

Dec. 23, 2011 (EP) ..................................... 11195473

(51) Int. Cl.
*G11C 13/00* (2006.01)
*H01L 45/00* (2006.01)
*H01L 27/24* (2006.01)

(52) U.S. Cl.
CPC ........ *G11C 13/003* (2013.01); *G11C 13/0004* (2013.01); *G11C 13/0007* (2013.01); *G11C 13/0011* (2013.01); *H01L 27/2454* (2013.01); *H01L 27/2481* (2013.01); *H01L 45/04* (2013.01); *H01L 45/06* (2013.01); *H01L 45/12* (2013.01); *H01L 45/1233* (2013.01); *H01L 45/143* (2013.01); *H01L 45/144* (2013.01); *H01L 45/146* (2013.01);
(Continued)

(58) Field of Classification Search
CPC . H01L 45/14; H01L 45/1608; H01L 45/1675; H01L 27/249; H01L 45/04; H01L 45/16; H01L 45/12

USPC ...................... 257/536, E29.325–E29.346, 5
See application file for complete search history.

(56) References Cited

U.S. PATENT DOCUMENTS

2003/0003674 A1    1/2003  Hsu et al.
2004/0136223 A1    7/2004  Hsu et al.
(Continued)

OTHER PUBLICATIONS

European Search Report, European Patent Application No. 11195473.1 dated Jun. 1, 2012.
(Continued)

*Primary Examiner* — Marc Armand
*Assistant Examiner* — Quinton Brasfield
(74) *Attorney, Agent, or Firm* — McDonnell Boehnen Hulbert & Berghoff LLP (57) ABSTRACT

The present invention provides a resistive memory array arranged in a 3D stack comprising a plurality of resistivity switching memory elements laid out in an array in a first and second direction, and stacked in a third direction, a plurality of first electrodes and a plurality of second electrodes extending in the first direction, each first electrode and each second electrode being associated with the at least one resistivity switching memory element, and a plurality of transistor devices, each transistor device being electrically coupled to one of the resistivity switching memory elements, an inversion or accumulation channel of a transistor device being adapted for forming a switchable resistivity path in the third direction, between the electrically coupled resistivity switching memory element and the associated second electrode, wherein the memory array furthermore comprises at least one third electrode provided in a trench through the stack.

12 Claims, 7 Drawing Sheets

(52) U.S. Cl.
CPC ............ *H01L 45/147* (2013.01); *H01L 45/16* (2013.01); *H01L 45/1666* (2013.01); *H01L 45/1675* (2013.01); *G11C 2213/71* (2013.01)

(56) References Cited

U.S. PATENT DOCUMENTS

| | | | |
|---|---|---|---|
| 2005/0110117 A1* | 5/2005 | Hsu ............................... | 257/536 |
| 2008/0049486 A1* | 2/2008 | Gruening-von Schwerin ...................... | 438/212 |
| 2008/0205118 A1 | 8/2008 | Gruening-von Schwerin et al. | |
| 2009/0014836 A1 | 1/2009 | Lee et al. | |
| 2009/0034355 A1 | 2/2009 | Wang | |
| 2009/0085121 A1 | 4/2009 | Park et al. | |
| 2009/0122592 A1* | 5/2009 | Tokiwa ......................... | 365/148 |
| 2010/0165724 A1 | 7/2010 | Pellizzer et al. | |
| 2010/0208509 A1 | 8/2010 | Mejima | |
| 2010/0237321 A1* | 9/2010 | Inaba .................... | H01L 27/228 257/379 |
| 2010/0248431 A1* | 9/2010 | Nishitani et al. ............. | 438/128 |
| 2010/0248441 A1* | 9/2010 | Gopalakrishnan ..... | B82Y 10/00 438/305 |
| 2011/0068409 A1* | 3/2011 | Kim .................. | H01L 29/66666 257/379 |
| 2011/0122676 A1* | 5/2011 | Murooka ............... | G11C 5/063 365/148 |
| 2011/0210301 A1* | 9/2011 | Nansei ................ | H01L 27/2409 257/2 |
| 2011/0299321 A1* | 12/2011 | Murooka ...................... | 365/148 |

OTHER PUBLICATIONS

Wang, Ching-Hua et al., "Three-Dimensional 4F2 ReRAM With Vertical BJT Driver by CMOS Logic Compatible Process", IEEE Transactions on Electron Devices—Special Issue on Characterization of Nano CMOS Variability by Simulation and Measurements, vol. 58, No. 8, Aug. 2011, pp. 2466-2472.

Wang, Ching-Hua et al., "Three-Dimensional 4F2 ReRAM Cell With CMOS Logic Compatible Process", Microelectronics Laboratory, Institute of Electronics Engineering, National Tsing-Hua University, 2010 IEEE, pp. 29.6.1-29.6.4.

* cited by examiner

STACKED RRAM ARRAY WITH INTEGRATED TRANSISTOR SELECTOR

CROSS-REFERENCE TO RELATED APPLICATION

This application claims priority to European Patent Application No. 11195473.1 filed on Dec. 23, 2011, the contents of which are hereby incorporated by reference.

FIELD OF THE INVENTION

The present invention relates to semiconductor memory devices, more particularly for example to arrays of non-volatile memory cells comprising a reversible resistance switching layer, their resistance value being representative of the data stored in the memory cell. The present invention in particular relates to a new array design for minimizing design area and to methods of fabrication thereof.

BACKGROUND OF THE INVENTION

A resistive memory device, such as for example the electrically programmable resistive cross point memory device as described in US2003/0003674, is a non-volatile memory device which generally comprises an active layer capable of having its resistivity changed in response to an electrical signal, interposed between a plurality of conductive top and bottom electrodes. The active layer usually comprises a dielectric material, such as for example one or more metal oxide layers, a solid electrolyte material, a magnetic tunnel junction of a phase change material, which may be interposed between two conductive electrodes, for example wire-shaped Pt-electrodes. At a cross point of a top electrode and a bottom electrode, a cross point referring to each position where a top electrode crosses a bottom electrode, the active layer has a programmable region with a resistivity that can change in response to an applied voltage. The memory effect of the resistive memory device lies in the programming of the memory device into two distinct resistive states.

Figure 1:
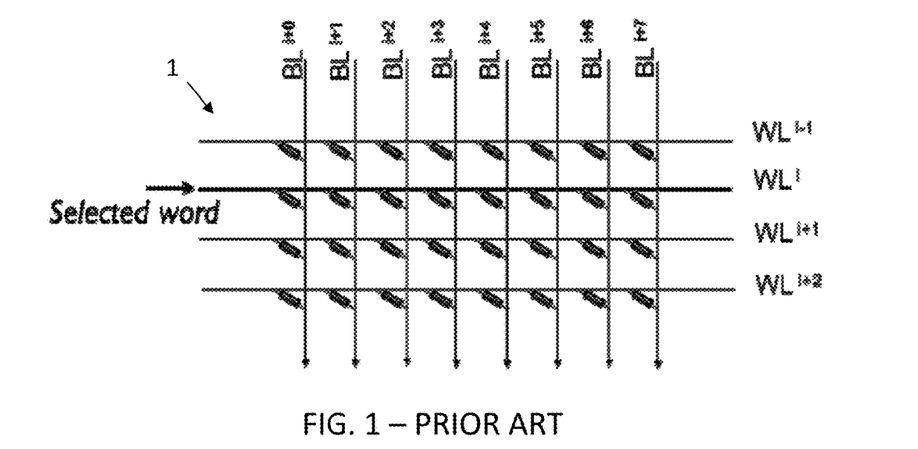
FIG. 1 is a schematic illustration of a prior art resistive memory raw cross-point array with a cross-bar array configuration of the top electrodes and the bottom electrodes.
Figure 2:
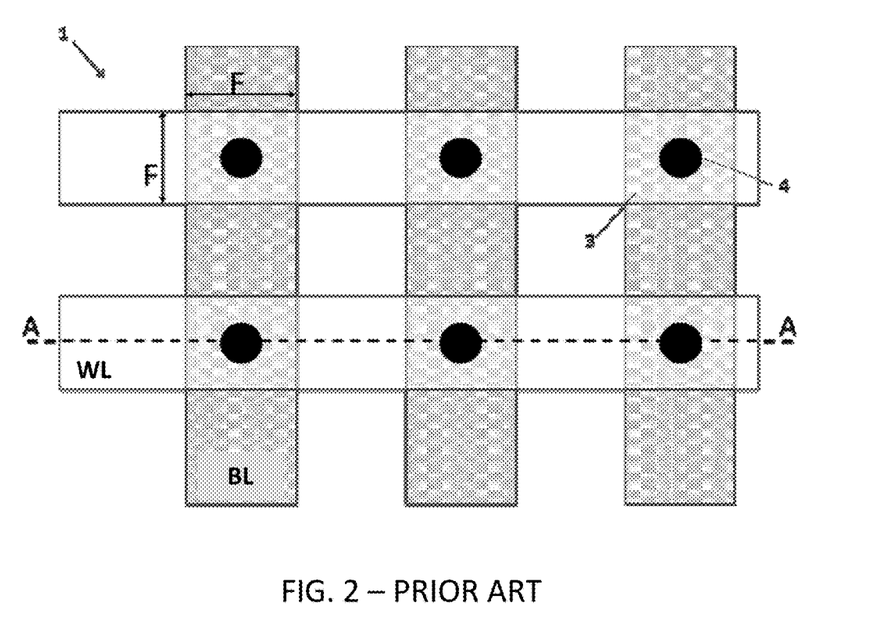
FIG. 2 is a top view of a portion of a prior art resistive memory array as in FIG. 1.
Figure 3:
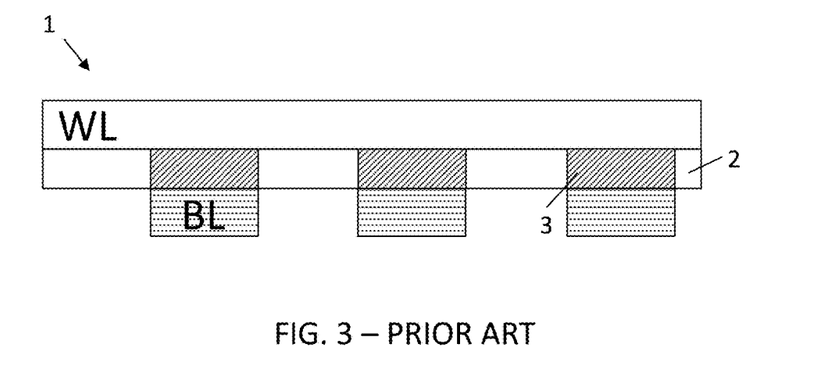
FIG. 3 is a cross-sectional view of the portion of a prior art resistive memory array of FIG. 2, taken along section A-A in FIG. 2. The shaded zones are the programmable regions in the active layer with changeable resistivity.

A resistive memory array, comprising a plurality of resistive memory elements, typically comprises a cross-bar array of top and bottom electrodes as illustrated schematically in FIG. 1, in top view in FIG. 2, and in cross-section in FIG. 3. The resistive memory device 1 comprises a plurality of top electrodes (e.g. word lines "WL") and a plurality of bottom electrodes (e.g. bit lines "BL") which, together with an active layer 2 between the top and bottom electrodes, form a plurality of cross-point memory elements. The active layer 2 is interposed between the plurality of word lines WL and bit lines BL. At each crossing of a word line WL with a bit line BL, a programmable region, i.e. a bit 3, is formed in the active layer 2. The resistivity of the bit 3 can be changed for example due to filament formation or filament disruption in response to a voltage or current applied between the corresponding word line WL and the bit line BL. The positions of the filaments are schematically indicated with closed circles 4 in FIG. 2. Supposing that the world lines WL and the bit lines BL each have a width F being the minimum width obtainable with a given technology, the density of the resistive memory device 1 as illustrated in FIG. 2 can be calculated to be 1 filament/$4F^2$, thus 1 bit/$4F^2$.

Such raw cross-point arrays with single RRAM elements lead to a large parasitic current flowing through non-selected memory cells. Hence raw cross-point arrays suffer from READ errors (sneak currents) and possibly from PROGRAM errors, as well as from excessive current and power consumption.

Figure 4:
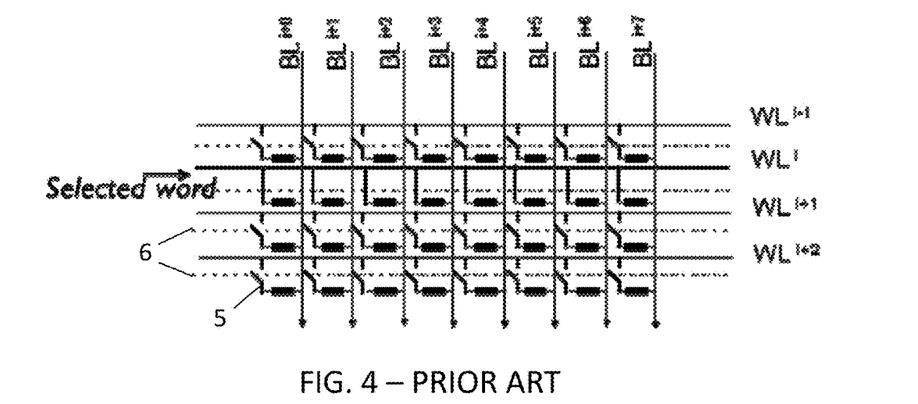
FIG. 4 is a schematic illustration of a prior art resistive memory array including a selector in each memory cell.

One solution to alleviate these problems is to put a selector 5 in each cell, as illustrated in FIG. 4. Ideally this can be a transistor, requiring the addition of another control word line 6, but also a (bipolar) diode/switch device has been proposed as a selector 5. Examples of resistive memory arrays comprising memory cells including selection transistors are given in US2009/014836.

Disadvantages of solutions including a selector 5 in each cell are the increase of the cell size, hence the reduced memory density, the more complex processing—not a simple cross-point array but requiring the definition of intermediate pillar elements—the fact that no appropriate two-terminal bipolar selector devices have been identified.

Accordingly, there is room for new structures and processing methods for manufacturing non-volatile memory cells, which allow a high cell density.

SUMMARY OF THE INVENTION

It is an object of embodiments of the present invention to provide high density non-volatile resistive memory arrays, for example three-dimensional ("3D") arrays.

The above objective is accomplished by a method and device according to embodiments of the present invention.

In one aspect, the present invention provides a resistive memory array arranged in a 3D stack, the stack comprising a plurality of resistivity switching memory elements laid out in an array in a first and second direction, and stacked in a third direction, a plurality of first electrodes ($BL_i$) extending in the first direction, each first electrode ($BL_i$) associated with at least one resistivity switching memory element, a plurality of second electrodes ($BL_{i+1}$) extending in the first direction, each second electrode ($BL_{i+1}$) associated with the at least one resistivity switching memory element, and a plurality of transistor devices, each transistor device being electrically coupled to one of the resistivity switching memory elements, an inversion or accumulation channel of a transistor device being adapted for forming a switchable resistivity path in the third direction, between the electrically coupled resistivity switching memory element and the associated second electrode, wherein the memory array furthermore comprises at least one third electrode provided in a trench through the stack.

According to embodiments the stack of first electrodes ($BL_i$), the resistivity switching memory elements, the second electrodes ($BL_{i+1}$) and the transistor devices are arranged in a continuous stripe in the first direction.

The plurality of transistor devices includes any of MOSFETs or pinch-off FETs or FinFETs.

The third direction is substantially perpendicular to the first direction.

In another aspect, the present invention provides a method of manufacturing a resistivity switching memory array arranged in a 3D stack, the method comprising providing a plurality of resistivity switching memory elements laid out in an array in a first and second direction, and stacked in a third direction, providing a plurality of first electrodes ($BL_i$) and second electrodes ($BL_{i+1}$) each extending in the first direction, first electrodes ($BL_i$) and second electrodes ($BL_{i+1}$) being and stacked in the third direction, each of the first electrodes ($BL_i$) and second electrodes ($BL_{i+1}$) associated with at least one resistivity switching memory element, and providing a plurality of transistor devices each electrically coupled with at least one resistivity switching memory element, wherein the transistor devices are adapted for each forming a switchable resistivity path in the third direction between the resistivity switching memory element and one of the second electrodes ($BL_{i+1}$), wherein the method furthermore comprises providing a trench through a stack of bit line material forming the first electrodes ($BL_i$) and second electrodes ($BL_{i+1}$), material forming the plurality of resistivity switching memory elements and semiconductor material forming the transistor devices, and filling the trench with word line material.

According to embodiments providing a plurality of first electrodes ($BL_i$) and second electrodes ($BL_{i+1}$) comprises providing at least one layer of conductive material, and patterning the layer of conductive material. Providing a plurality of transistor devices comprises providing at least one layer of semiconductor material and patterning the layer of semiconductor material.

According to embodiments, the method further including providing at least one layer of resistivity switching material and patterning the layer of resistivity switching material, wherein patterning the layers of conductive material, resistivity switching material and semiconductor material is performed in a single patterning step.

In another aspect, the present invention provides an integrated circuit having a resistivity switching memory, comprising a resistivity switching memory element, a first electrode associated with the resistivity switching memory element, a second electrode associated with the resistivity switching memory element, and a transistor device electrically coupled to the resistivity switching memory element. An inversion or accumulation channel of the transistor device is adapted for forming a switchable resistivity path, also called a virtual electrode, between the resistivity switching memory element and the second electrode. It is an advantage that such resistivity switching memories can easily be provided in an array structure. It is a further advantage that such resistivity switching memories can be placed close to one another, thus allowing high density memory devices to be created.

In an integrated circuit according to embodiments of the present invention, the transistor device may be any of a MOSFET, a pinch-off FET or a FinFET. The transistor device is a three-terminal device.

The transistor device may include a channel area extending in a direction substantially perpendicular to a surface of a substrate onto which the resistivity switching memory is provided.

Advantageously, between the resistivity switching memory element and the transistor device no layer of material is present which can be conductive without being switched, hence e.g. no metallic layers are present between the resistivity switching memory element and the transistor device. The conductivity of the electrical path between the resistivity switching memory element and the electrode is controlled by the transistor device. The transistor device is configured to switch on and/or off the current between the resistivity switching memory element and the electrode.

In a further aspect, the present invention provides a resistive memory array comprising a plurality of integrated circuits as in any of the embodiments of the previous aspect.

A resistive memory array according to embodiments of the present invention may comprise a plurality of resistivity switching memory elements, a plurality of first electrodes each associated with at least one resistivity switching memory element, a plurality of second electrodes each associated with the at least one resistivity switching memory element, and a plurality of transistor devices, each transistor device being electrically coupled to one of the resistivity switching memory elements. An inversion or accumulation channel of a transistor device may be adapted for forming a switchable resistivity path between the electrically coupled resistivity switching memory element and the associated second electrode.

In a resistive memory array according to embodiments of the present invention, the plurality of first electrodes may be arranged in a first direction, and a stack of first electrodes, resistivity switching memory elements, second electrodes and transistor devices may be arranged in a continuous stripe over a plurality of cells in the first direction.

In advantageous embodiments of a resistive memory array according to embodiments of the present invention, the plurality of transistor devices may be any of MOSFETs, pinch-off FETs, or FinFETs.

In embodiments of the present invention, the plurality of resistivity switching memory elements may be arranged in a 3D stack. Such 3D stack may be formed of stripes of bit line-transistor-resistivity switching material stacks, which stripes are arranged adjacent one another but spaced apart from one another, overlaid with word lines in a direction substantially perpendicular to the stripes of bit line stacks. The bit lines are all parallel to one another, and preferably the bit line stacks all have the same height and width.

In a resistive memory array according to embodiments of the present invention, at least some of the plurality of resistivity switching memory elements may be logically arranged in rows and columns. The rows and columns may be substantially orthogonal to one another. The plurality of first electrodes may be arranged along the rows of the array. The word lines may be arranged substantially perpendicular to the bit lines.

In yet another aspect, the present invention provides a method of manufacturing a resistivity switching memory array. The method comprises providing a plurality of resistivity switching memory elements, providing a plurality of first electrodes and second electrodes each associated with at least one resistivity switching memory element, and providing a plurality of transistor devices each electrically coupled with at least one resistivity switching memory element. The transistor devices are adapted for each forming a switchable resistivity path between the resistivity switching memory element and one of the second electrodes.

In a method according to embodiments of the present invention, providing a plurality of resistivity switching memory elements may include providing resistivity switching memory elements in a 3D stack.

Providing a plurality of first electrodes and second electrodes may comprise providing at least one layer of conductive material and patterning the layer of conductive material.

Providing a plurality of resistivity switching memory elements may comprise providing at least one layer of resistivity switching material and patterning the layer of resistivity switching material.

Providing a plurality of transistor devices may comprise providing at least one layer of semiconductor material and patterning the layer of semiconductor material.

In particular embodiments, patterning the layers of conductive material, resistivity switching material and semiconductor material may be performed in a single patterning step.

In still another embodiment, the present invention provides a method of addressing a resistivity switching memory element in an array according to embodiments of the present invention. The method comprises selecting a first bit line and a second bit line associated with the resistivity switching memory element to be addressed, and selecting a transistor device associated with the resistivity switching memory element to be addressed, an inversion or accumulation channel of the transistor device thereby forming a conductive path between the resistivity switching memory element and the second electrode. Addressing may be any of programming or reading.

It is an advantage of embodiments of the present invention that cells with the smallest cell size in a raw cross-point array can be realized, thereby, however, reducing sneak currents compared to a prior art raw cross-point array, or even avoiding these.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims.

The terms first, second, and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under, and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

BICS (Bit Cost Scalable) technology is known as a technology for suppressing a bit cost of a semiconductor memory by increasing the capacity thereof by a three dimensional structure.

A non-volatile semiconductor memory to which the BICS technology is applied (hereinafter called BICS memory) has a feature in that it not only has a three-dimensional structure but also makes bit cost scalability possible so that a bit cost can be reduced in proportion to an increase of the number of stacked layers by devising a device structure and a process technology.

In the context of the present invention, a resistive random-access memory (RRAM) is a non-volatile memory type having as basic idea that a dielectric, which is normally insulating, can be made to conduct through a filament or conduction path formed after application of a sufficiently high voltage. Once the filament is formed, it may be reset (broken, resulting in high resistance) or set (re-formed, resulting in lower resistance) by an appropriately applied voltage.

In a raw cross-point cell, a pure RRAM memory element is used as a basic memory cell, resulting in a configuration where parallel bit lines are crossed by perpendicular word lines with the switching material placed between word line and bit line at every cross-point. In this architecture, large parasitic currents flow through non-selected memory cells.

In the context of the present invention, "with an electrode" means a layer of material which is intrinsically electrically conductive. "With a switchable electrode" means a layer of material of which the electrical conductivity may be switched on or off, e.g. when applying a voltage across or to that material. Such a switchable electrode may also be called a virtual electrode or a switchable resistivity path, i.e. an electrical path having switchable resistivity (high resistivity or low resistivity, whereby high resistivity means that in normal operating conditions substantially no electrical current flows, and low resistivity means that in normal operating conditions electrical current can flow).

Figure 5:
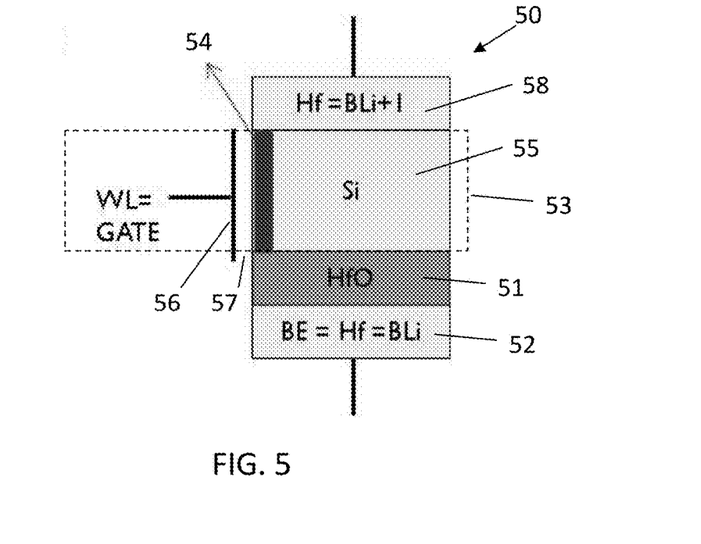
FIG. 5 is a schematic illustration of a resistivity switching memory cell according to embodiments of the present invention.

In a first aspect, the present invention provides a resistivity switching memory cell 50. Such resistivity switching memory cell 50 according to embodiments of the present invention is illustrated in FIG. 5. The resistivity switching memory cell 50 comprises a resistivity switching memory element 51, for example, but not limited thereto, a HfO layer; a first electrode 52 associated with and located at a first side of the resistivity switching memory element 51, for example, but not limited thereto, a Hf electrode; and a second electrode 58 associated with and located at a second side of the resistivity switching memory element, opposite to the first side, for example, but not limited thereto, a Hf electrode. In between the resistivity switching memory element 51 and the second electrode 58, a transistor device 53 is provided, which is electrically coupled to the resistivity switching memory element 51. An inversion channel 54 of the transistor device 53 (or an accumulation channel in case the transistor device is a pinch-off FET) may be formed by appropriately switching the transistor device 53, this inversion or accumulation channel 54 being adapted for forming a switchable resistivity path. By actuating the first electrode 52, the second electrode 58 and a gate electrode 56 so as to form the inversion or accumulation channel 54, a suitable voltage may be applied over the resistivity switching memory element 51 for changing the resistivity of this element 51.

In embodiments of the present invention, the transistor device 53 includes a channel area 54 extending in a direction substantially perpendicular to a surface of a substrate onto which the resistive switching memory cell 50 is manufactured. The transistor device 53 may, for example be a FET (field-effect transistor), such as e.g. a pinch-off FET or a MOSFET. The transistor may be a vertical transistor, i.e. a transistor having it channel in a direction substantially perpendicular to the substrate onto which the transistor is provided.

A transistor device 53 may be formed in a semiconductor layer 55, e.g. a silicon layer, on top of the resistivity switching layer 51. At a side of the semiconductor layer 55, the gate electrode 56 is provided, sandwiching a gate dielectric 57 between the gate electrode 56 and the semiconductor layer 55. By applying a suitable electrical signal to the gate electrode 56, an inversion or accumulation channel 54 may be formed in the semiconductor layer 55. In accordance with embodiments of the present invention, this inversion or accumulation channel 54 may be used as a switchable electrode between the resistivity switching memory element and the second electrode, for changing the content, i.e. a stored value, of the resistivity switching memory cell 50.

In accordance with embodiments of the present invention, the transistor device 53 is provided between the resistivity switching memory element 51 and the second electrode 58, and no other electrode is provided between the resistivity switching memory element 51 and the second electrode 58. This means that, in embodiments of the present invention, there may be a direct contact between the resistivity switching memory element 51 and the transistor device 53.

In accordance with embodiments of the present invention, the electrical path between the resistivity switching memory element 51 and the second electrode 58 is controlled by the transistor device 53. This transistor device 53 is configured to switch on and switch off the current between the resistivity switching memory element 51 and the second electrode 58. The type of transistor device used determines where the current path is provided, e.g. determines the width of the part of the semiconductor layer 55 where current can flow.

In a second aspect, the present invention provides a resistive memory array comprising a plurality of resistivity switching memory cells 50 in accordance with embodiments of the first aspect of the present invention. The array may be a 3D array, i.e. an array having a plurality of resistivity switching memory cells adjacent one another in a plane, and other resistivity switching memory elements laying in other planes substantially parallel with that plane.

Figure 6:
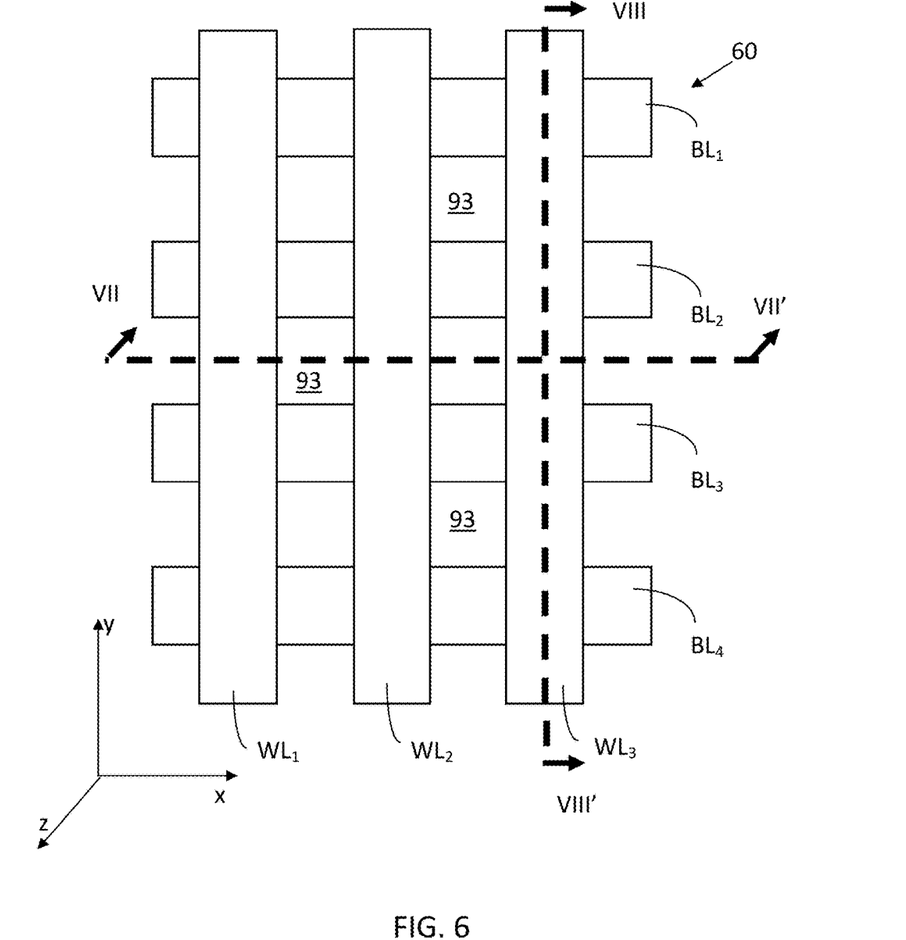
FIG. 6 is a top view of a schematic illustration of orientation of word lines and bit lines in an array according to embodiments of the present invention.
Figure 7:
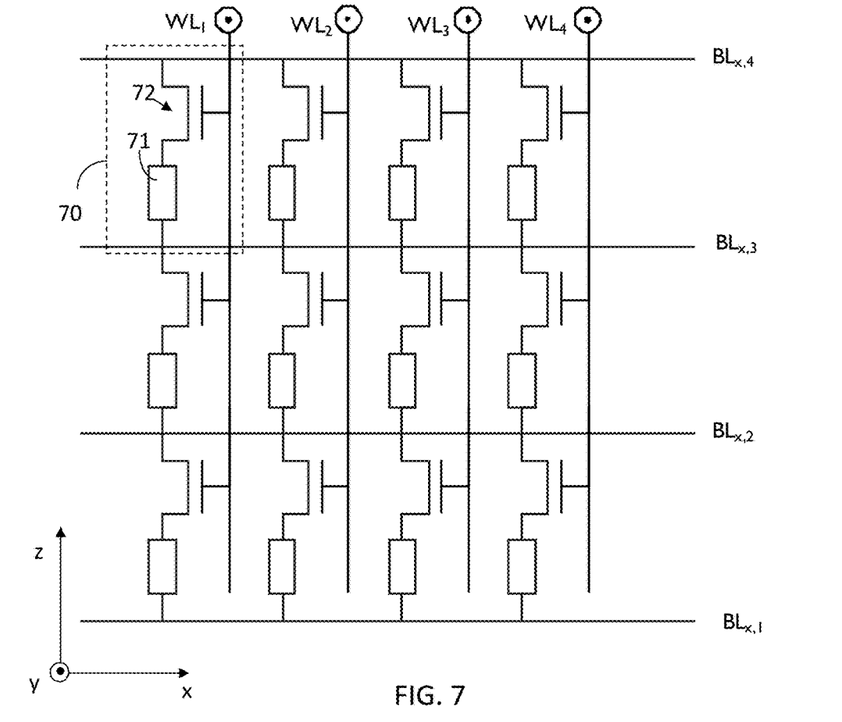
FIG. 7 is a schematic cross-sectional view along bit lines of an array according to embodiments of the present invention.
Figure 8:
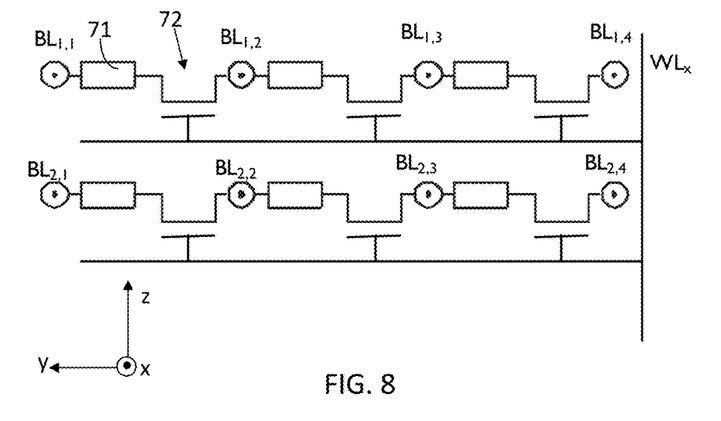
FIG. 8 is a schematic cross-sectional view along word lines of an array according to embodiments of the present invention.

FIG. 6 schematically illustrates a top view of a portion of a resistive memory array 60 according to a particular embodiment of the present invention. The resistive memory array 60 comprises a plurality of resistive memory elements (not illustrated in FIG. 6) logically arranged in two dimensions in rows and columns (x and y), and in a third dimension (z) in layers. Rows and columns are arranged in a plane and form a layer of resistive memory elements. In accordance with embodiments of the present invention, different layers of resistive memory elements may be stacked on top of one another. FIG. 7 and FIG. 8 schematically illustrate a cross-section through a stack of such layers. Throughout this description, the terms "horizontal" and "vertical" (related to the terms "row" and "column" respectively) are used to provide a co-ordinate system in a layer, and for ease of explanation only. They do not need to, but may, refer to an actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the present disclosure refers to logically organized in rows and columns. By this is meant that sets of memory elements are linked together in a topologically linear intersecting manner; however, that the physical or topographical arrangement need not be so. For example, the rows may be circles and the columns radii of these circles and the circles and radii are described in this invention as "logically organized" rows and columns. Moreover, throughout this description, the term "depth" (related to the term "layer") is used to provide another direction in the coordinate system defined by the terms "horizontal" and "vertical". For the ease of explanation, axes have been drawn in FIG. 6, with x and y-axes along rows and columns, respectively, and z-axis along the depth direction.

The resistive memory array 60 furthermore comprises a plurality of word lines $WL_i$ (in the embodiment illustrated $1 \leq i \leq 3$, but in practical realizations i is often much larger than 3) arranged in the depth direction (z-direction) of the array of memory elements and word lines arranged on a single column of memory elements (y-direction) being electrically connected to one another. The resistive memory array 60 further comprises a plurality of bit lines $BL_j$ (in the embodiment illustrated $1 \leq j \leq 4$, but in practical realizations j is often much larger than 4) arranged in the direction of the rows of memory elements (x-direction). What cannot be seen in FIG. 6 but is clear from FIG. 7, is that a plurality of bit lines are stacked on top of one another; at least a first and a second bit line, respectively connecting the first electrode 52 and the second electrode 58 of a memory cell 50 as illustrated in FIG. 5.

In particular embodiments, where the word lines $WL_i$ and the bit lines $BL_j$ are arranged in the form of a Cartesian array, the word lines $WL_i$ are parallel to one another, and the bit lines $BL_j$ are parallel to one another. The word lines $WL_i$ may be arranged perpendicular to the bit lines $BL_j$. In alternative embodiments, the bit lines $BL_j$ may be arranged as concentric circles or as radii of such circles. Specific names of the various lines, e.g. word line and bit line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

Schematic cross-sectional views of the array illustrated in FIG. 6 are illustrated in FIG. 7 and FIG. 8, where FIG. 7 illustrates a horizontal cross-section according to line VII-VII' in FIG. 6, and FIG. 8 illustrates a vertical cross-section according to line VIII-VIII' in FIG. 6.

FIG. 7 illustrates a layer of memory cells 70, at a particular level x. A plurality of bit lines $BL_{x,j}$ are provided in that layer x. Each memory cell 70 comprises a resistivity switching memory element 71 and a transistor device 72. A first electrode is electrically associated with the resistivity switching memory element 71, the first electrode being formed by a first bit line $BL_{x,j}$ adjacent the memory element 71, and a second electrode is electrically associated with the resistivity switching memory element 71, the second electrode being formed by a second bit line $BL_{x,j+1}$. An inversion or accumulation channel of the transistor device 72 is adapted for forming a switchable resistivity path between the resistivity switching memory element 71 and the second electrode. This switchable resistivity path may be switched to high resistivity or to low resistivity by appropriately controlling the transistor device 72.

FIG. 8 illustrates a vertical cross-section along line VIII-VIII' through the array illustrated in FIG. 6. FIG. 8 illustrates a plurality of layers comprising memory cells according to embodiments of the present invention. Two layers are illustrated in FIG. 8. Each layer comprises a plurality of bit lines BLz,j, where z refers to a particular layer in the stack, and j refers to a particular bit line in a layer.

It can be seen in the drawings, in particular in FIG. 7 and FIG. 8 that the word lines, when performing their function as word line, i.e. when controlling the switching of the resistivity switching memory element 71, at the same time function as select lines for switching the transistor device 72, thus controlling the conductivity of the semiconductor layer 55 forming part of the transistor device 72. A suitable voltage applied to the word line WL, in combination with the voltage applied to the two bit lines BL associated with the resistivity switching memory element 71, allows to switch or not switch the resistivity of the memory element 71.

Figure 12:
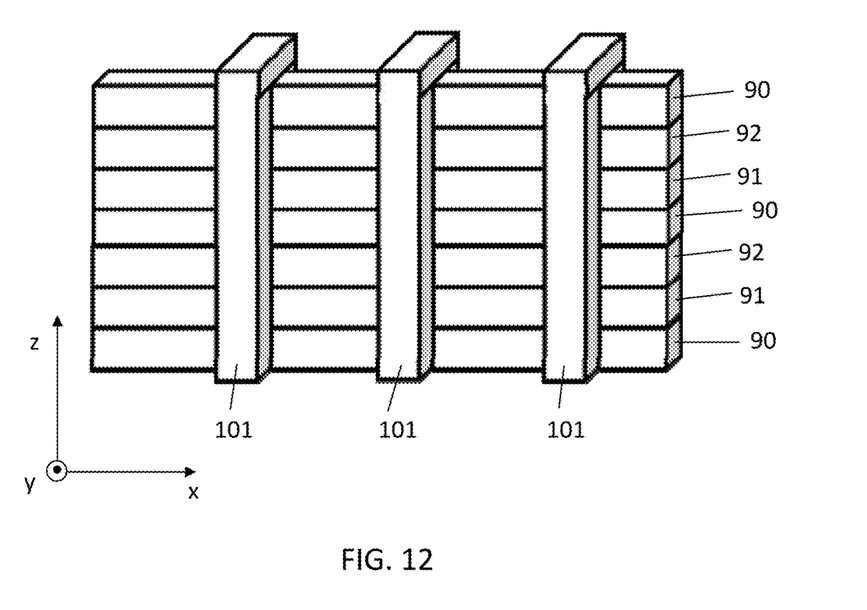
FIG. 12 is a schematic 3D illustration of part of a resistive memory array according to embodiments of the present invention.

A 3D cross-sectional view along line VII-VII' in FIG. 6 is illustrated in FIG. 12. It can be seen from FIG. 12 that material layers are stacked in the depth direction (z-direction), which stacks run in bit line direction (also called the first direction in the context of the present invention, or the x-direction), thus forming a stripe of a material stack, the stripes of material stacks are overlaid with word lines WLi running in a direction substantially perpendicular to the first direction. The word lines furthermore fill part of the space in depth direction, between two stripes of stacks of material in the first direction. Neighbouring word lines in the x-direction are electrically insulated from one another.

In a third aspect, the present invention provides a method of manufacturing a resistivity switching memory array. Such method according to embodiments of the present invention is described herein below.

First, a substrate (not illustrated in the drawings) is provided. In embodiments of the present invention, the term "substrate" may include any underlying material or materials that may be used, or upon which a device according to embodiments of the present invention may be formed. In particular embodiments, this "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. As examples, the substrate may be made of any suitable material, whether amorphous, polycrystalline or crystalline, such as $LaAlO_3$, Si, TiN or other material.

Figure 9:
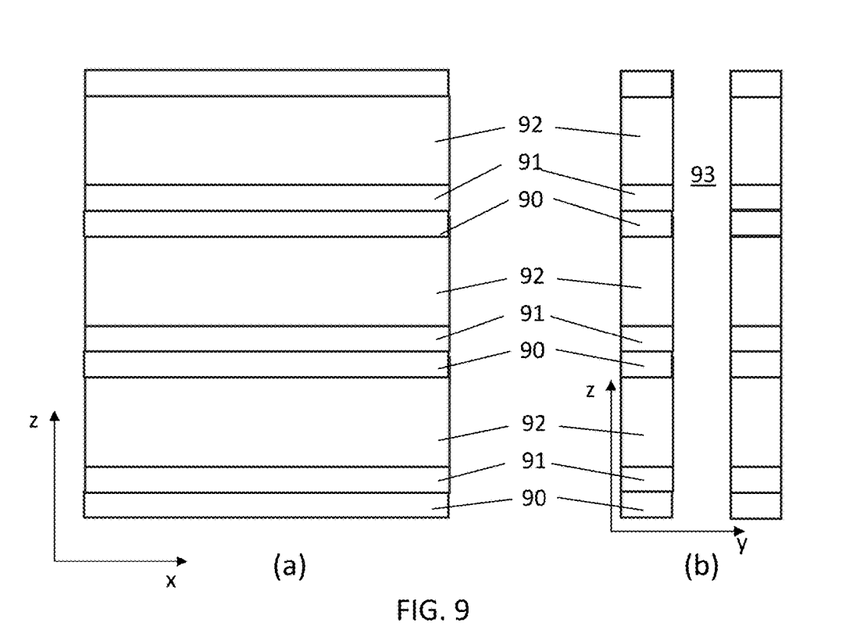
FIG. 9 illustrates different layers deposited during a method of manufacturing an array according to embodiments of the present invention.

On or in a major surface of the substrate, a plurality of layers is provided. The layers are a sequence of a layer of bit line material 90 (bottom electrode), an active layer 91 made of a material capable of having its resistivity changed in response to an electrical signal, and a layer of semiconductor material 92. Such stack of layers comprising a layer of bit line material 90, an active layer 91 and a layer of semiconductor material 92 may be stacked onto one another as many times as the number of layers required in the array.

The layers of bit line material 90 may be made of conductive material, including metals, e.g. poly-silicon, TiSiC, C, TiW, SiC, Ti, V, W, Cr, Fe, Ni, Nb, Pd, Pt, Zr, Mo, Cu, Al, Ag, Au, Hf and alloys thereof; conductive oxides e.g. $IrO_2$, $RuO_2$, $IrRuO_3$, $LiNbO_3$; metal nitrides, e.g. TiAlN, TiN, TaN, TiSiN, TiCN, TaSiN, MoN, TaAlN, WN; metal silicides e.g. TiSix, NiSix, CoSix; or combinations of any of the above. The layer of bit line material may also be formed of a stack of one or more of these materials. In particular embodiments, the conductive material may be a material such as $YBa_2Cu_3O_7$ (YBCO) that allows the epitaxial growth of an overlying perovskite material. The layers of bit line material 90 may have a thickness in the range of between about 5 nm and about 500 nm. The layers of bit line material 90 may be made of the same material throughout the stack, or layers of different bit line material may be provided at different locations. The layers of bit line material 90 may have substantially the same thickness at different locations (different levels) in the stack, or different layers may have different thicknesses.

The active layers 91 are deposited overlying the layers of bit line material 90. The active layers 91 are made of a material capable of having its resistivity changed in response to an electrical signal. The active material may be a metal oxide (binary oxides from transition metals as NiO, HfO, TaO, ZrO, AlO, NbO, TiO, . . . ), optionally with a metallic cap layer (Hf, Ti, Al, Zr, . . . ) on one side different from the side where the transistor resides, or complex oxides such as PrCaMnO (PCMO), or (doped) perovskite oxides, for example Cr:SrTiO3, or it can be a solid electrolyte layer with incorporated Al or Cu, such as Cu(Al) Selenides or Tellerium compounds, or it can be combinations of multilayer stacks of different of the above layers combined. Alternatively, it can be phase change materials as e.g. GeSbTe, doped SbTe, or AsInSbTe. The active layers 91 may for example have a thickness between 5 nm and 500 nm. The active layers 91 can be deposited using any suitable deposition technique, including pulsed laser deposition, rf-sputtering, e-beam evaporation, thermal evaporation, atomic layer deposition, sol gel deposition, chemical vapor deposition. The active layer material is deposited over substantially the complete surface of the substrate, and is removed from outside the memory area by wet or dry etching or any other suitable process.

The layers of semiconductor material 92 may be made of any type of semiconductor material capable of forming an inversion or accumulation channel if a suitable voltage is applied. The layers of semiconductor material can for example be layers of Si, polysilicon, Ge, SiGe, GaAs. The layers of semiconductor material may have a thickness between 5 and 50 nm. The layers of semiconductor material may be deposited by any suitable method, e.g. CVD (chemical vapor deposition), ALD (atomic layer deposition).

Once the stack has been created, at least one trench 93 is formed there through, in the direction of the bit lines (x-direction) so as to separate different bit lines from one another. This is illustrated in FIG. 9(b). The trench 93 may be formed through the complete stack, i.e. down to the bottom of the stack. The trench 93 may be formed by etching, but finding the right etch chemistries might be difficult, as the stack to be etched might comprise materials which are difficult to etch. However, scaling of the structure is easy.

Figure 10:
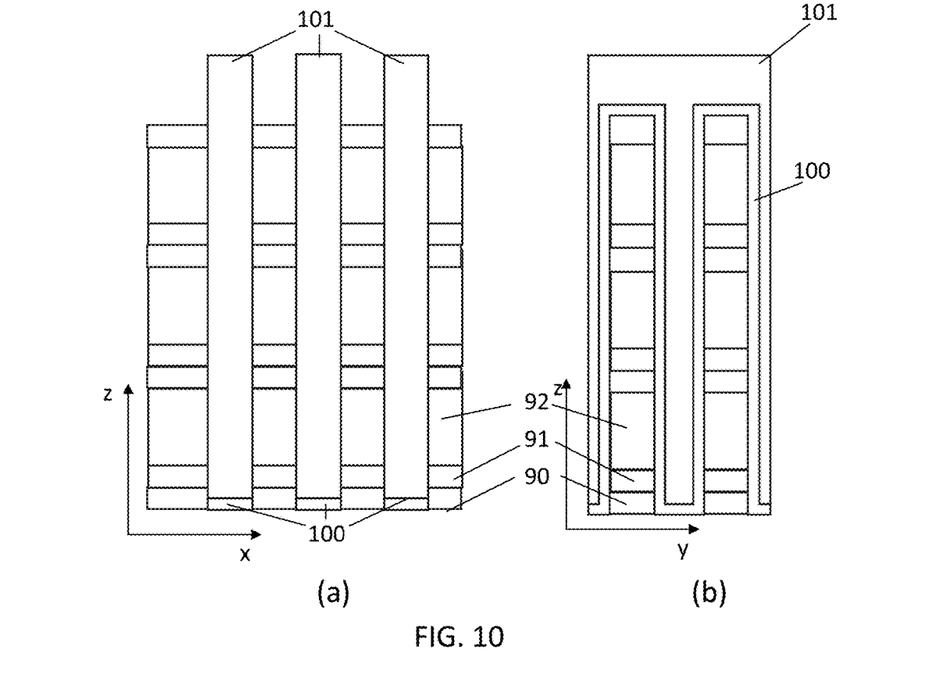
FIG. 10 illustrates a further method step during manufacturing an array according to embodiments of the present invention, whereby word lines have been provided.

As can be seen in FIG. 10(b), a layer of dielectric material 100 may be applied inside the trench. The dielectric material may for example be $SiO_2$ or any other material suitable to function as a gate dielectric.

Over the layer of dielectric material 100, a layer of word line material 101 is provided, filling the trench 93. The word line material may be conductive material, including metals, e.g. poly-silicon, TiSiC, C, TiW, SiC, Ti, V, W, Cr, Fe, Ni, Nb, Pd, Pt, Zr, Mo, Cu, Al, Ag, Au, Hf and alloys thereof; conductive oxides e.g. $IrO_2$, $RuO_2$, $IrRuO_3$, $LiNbO_3$; metal nitrides, e.g. TiAlN, TiN, TaN, TiSiN, TiCN, TaSiN, MoN, TaAlN, WN; metal silicides e.g. TiSix, NiSix, CoSix; or combinations of any of the above. After filling the trenches 93 with word line material, this word line material is patterned and removed from locations where no word line material should be present. Optionally, the freed spaces between the word lines in the former trenches 93 may be filled with insulating material. FIG. 10(a) illustrates a side view of a structure in accordance with embodiments of the present invention, and FIG. 12 illustrates a 3D side view from the same structure, where no insulating material is provided between neighboring word lines.

It is clear from the above that a resistive memory array according to embodiments of the present invention may be constructed by making stacks (in bit line direction) of bit lines, serving as bottom electrode for a resistive element, resistive elements, semiconducting material part of which may serve as the channel of a transistor device, e.g. a dual gate vertical flow fully depleted finFET device, and finally a second bit line, serving as top electrode. The word lines are perpendicular to the bit lines and serve as gate electrodes for the above mentioned transistor devices.

A method according to embodiments of the present invention has a significant advantage over prior art 3D stacking concepts: as there is no need for a complex stack between the bit lines (or between the word lines) the minimum half-pitch of both bit lines and word lines can theoretically be reduced down to 10 nm or below (while only requiring two lithography steps for an arbitrary number of stacked memory layers), so that it can be scaled to a very high memory density.

In a fourth aspect, a method is provided for addressing, e.g. for programming or read-out, a resistivity switching memory element in an array according to the second aspect of the present invention. The method comprises selecting a particular word line by putting an appropriate voltage level on that word line. This induces the formation of induction channels in each of the semiconductor material layers adjacent the selected word line. Furthermore, the method comprises selecting a first bit line and a second bit line, associated with the resistivity switching memory element to be addressed, by applying an appropriate electrical signal, e.g. voltage or current, to these bit lines. By applying these electrical signals to the bit lines, the resistivity of the resistivity switching memory element may be switched.

Figure 11:
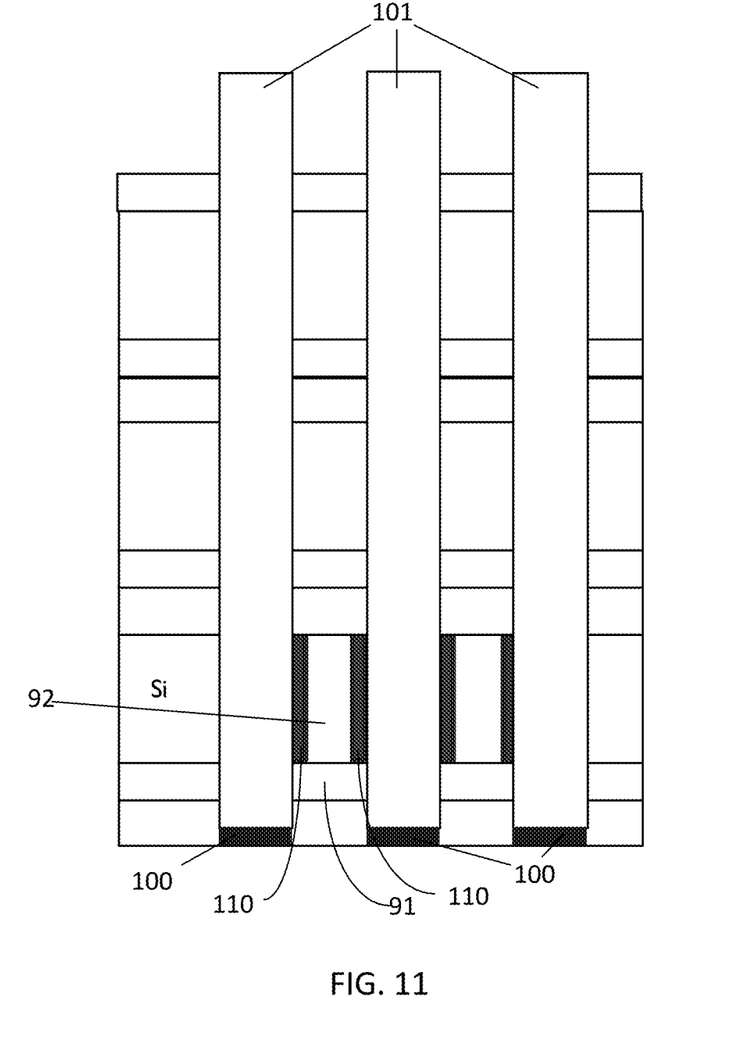
FIG. 11 illustrates formation of inversion or accumulation channels in memory cells in a array according to embodiments of the present invention.

It is an advantage of embodiments of the present invention that a resistive element, for example the resistive element indicated 91 in FIG. 11 can be driven from two sides, thus generating two inversion or accumulation channels 110 as illustrated in FIG. 11. This provides increased storage capabilities, which may be expressed as smaller memories having a same storage capacity, or same sized memories having a larger storage capacity. The semiconductor material 92 between the two inversion or accumulation channels 110 serves as isolation layer in between such that the channels can be driven separately. A value (bit) may be stored independently in a single cell at either side of the resistivity switching memory material.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments, but only by the claims.

What is claimed is:

1. A resistive memory array arranged in a three-dimensional ("3D") stack, the 3D stack comprising:
    a first stack of memory cells and a second stack of memory cells, the first stack of memory cells and the second stack of memory cells being separated by a trench, each stack of memory cells comprising one or more layers of memory cells, each layer of memory cells comprising:
       a layer of resistivity switching material that provides a plurality of resistivity switching memory elements;
       a first layer of bit line material that provides a plurality of first electrodes, wherein each first electrode is associated with at least one resistivity switching memory element;
       a second layer of bit line material that provides a plurality of second electrodes, wherein each second electrode is associated with at least one resistivity switching memory element; and
       a layer of semiconductor material that provides a plurality of transistor devices, each transistor device being electrically coupled to one of the resistivity switching memory elements, at least one channel of each transistor device forming a switchable resistivity path between the electrically coupled resistivity switching memory element and a second electrode associated with the electrically coupled resistivity switching memory element; and
    one or more word line electrodes in the trench;
    wherein the trench extends through the 3D stack such that (i) the trench separates each first layer of bit line material of the first stack of memory cells from each first layer of bit line material of the second stack of memory cells and (ii) the trench separates each second layer of bit line material of the first stack of memory cells from each second layer of bit line material of the second stack of memory cells;
    wherein for each layer of memory cells, each of the layer of resistivity switching material, the first layer of bit line material, the second layer of bit line material, and the layer of semiconductor material extends in a first direction and is parallel to a plane defined by the first direction and a second direction;
    wherein the one or more layers of memory cells in each stack of memory cells are stacked in a third direction that is substantially perpendicular to the plane defined by the first direction and the second direction;
    wherein for each layer of memory cells, the first layer of bit line material, the second layer of bit line material, the layer of semiconductor material, and the layer of resistivity switching material are stacked in the third direction such that, in the third direction, the layer of semiconductor material and the layer of resistivity switching material are between the first layer of bit line material and the second layer of bit line material, and wherein the layer of semiconductor material separates the second layer of bit line material from the layer of resistivity switching material; and
    wherein each of the one or more word line electrodes extends in the trench in the third direction.

2. The resistive memory array of claim 1, wherein, for each layer of memory cells, the first layer of bit line material, the layer of resistivity switching material, the layer of semiconductor material, and the second layer of bit line material are each arranged in a continuous stripe that extends in the first direction.

3. The resistive memory array according to claim 1, wherein each transistor device in the plurality of transistor devices is one of a MOSFET, a pinch-off FET, or a FinFET.

4. The resistive memory array of claim 1, further comprising one or more insulation layers in the trench, wherein each of the one or more insulation layers separates and is substantially parallel to two of the one or more word line electrodes.

5. The resistive memory array of claim 1, wherein each word line electrode comprises an outer layer of dielectric material extending in the third direction and an inner layer of patterned word line material extending in the third direction.

6. The resistive memory array of claim 1, wherein
    each word line electrode is a gate electrode for one or more transistor devices included in the plurality of transistor devices in the first stack of memory cells,
    each word line electrode is a gate electrode for one or more transistor devices included in the plurality of transistor devices in the second stack of memory cells, and
    each word line electrode extends from at least a top of the trench to a bottom of the trench.

7. The resistive memory array of claim 1, wherein the one or more word line electrodes comprise a first word line electrode and a second word line electrode, wherein the first word line electrode and the second word line electrode are gate electrodes for each of one or more transistor devices in the first stack of memory cells, and wherein a first transistor device included in the one or more transistor devices is configured to be driven by a voltage from either the first word line electrode or the second word line electrode.

8. The resistive memory array of claim 7, wherein the first transistor device comprises a first channel in the third direction and a second channel in the third direction, wherein the first word line electrode is parallel and adjacent to the first channel and the second word line electrode is parallel to and adjacent to the second channel, and wherein semiconductor material between the first channel and the second channel isolates the first channel from the second channel.

9. The resistive memory array of claim 8, wherein each of the first channel and the second channel is one of an accumulation channel or an inversion channel.

10. A resistive memory array arranged in a three-dimensional ("3D") stack, the 3D stack comprising:
   a first stack of memory cells and a second stack of memory cells, the first stack of memory cells and the second stack of memory cells being separated by a trench, each stack of memory cells comprising one or more layers of memory cells, each layer of memory cells comprising:
      a layer of resistivity switching material that provides a plurality of resistivity switching memory elements;
      a first layer of bit line material that provides a plurality of first electrodes, wherein each first electrode is associated with at least one resistivity switching memory element;
      a second layer of bit line material that provides a plurality of second electrodes, wherein each second electrode is associated with at least one resistivity switching memory element; and
      a layer of semiconductor material that provides a plurality of transistor devices, each transistor device being electrically coupled to one of the resistivity switching memory elements, at least one channel of each transistor device forming a switchable resistivity path between the electrically coupled resistivity switching memory element and a second electrode associated with the electrically coupled resistivity switching memory element; and
   one or more word line electrodes in the trench;
   wherein the trench extends through the 3D stack such that (i) the trench separates each first layer of bit line material of the first stack of memory cells from each first layer of bit line material of the second stack of memory cells and (ii) the trench separates each second layer of bit line material of the first stack of memory cells from each second layer of bit line material of the second stack of memory cells;
   wherein for each layer of memory cells, each of the layer of resistivity switching material, the first layer of bit line material, the second layer of bit line material, and the layer of semiconductor material extends in a first direction and is parallel to a plane defined by the first direction and a second direction;
   wherein for each layer of memory cells, the first layer of bit line material, the second layer of bit line material, the layer of semiconductor material, and the layer of resistivity switching material are stacked in a third direction that is substantially perpendicular to the plane defined by the first direction and the second direction such that, in the third direction, the layer of semiconductor material is in direct contact with the second layer of bit line material; and
   wherein each of the one or more word line electrodes extends in the trench in the third direction.

11. A resistive memory array arranged in a three-dimensional ("3D") stack, the 3D stack comprising:
   a first stack of memory cells and a second stack of memory cells, the first stack of memory cells and the second stack of memory cells being separated by a trench, each stack of memory cells comprising one or more layers of memory cells, each layer of memory cells comprising:
      a layer of resistivity switching material that provides a plurality of resistivity switching memory elements;
      a first layer of bit line material that provides a plurality of first electrodes, wherein each first electrode is associated with at least one resistivity switching memory element;
      a second layer of bit line material that provides a plurality of second electrodes, wherein each second electrode is associated with at least one resistivity switching memory element; and
      a layer of semiconductor material that provides a plurality of transistor devices, each transistor device being electrically coupled to one of the resistivity switching memory elements, at least one channel of each transistor device forming a switchable resistivity path between the electrically coupled resistivity switching memory element and a second electrode associated with the electrically coupled resistivity switching memory element; and
   one or more word line electrodes in the trench;
   wherein the trench extends through the 3D stack such that (i) the trench separates each first layer of bit line material of the first stack of memory cells from each first layer of bit line material of the second stack of memory cells and (ii) the trench separates each second layer of bit line material of the first stack of memory cells from each second layer of bit line material of the second stack of memory cells;
   wherein for each layer of memory cells, each of the layer of resistivity switching material, the first layer of bit line material, the second layer of bit line material, and the layer of semiconductor material extends in a first direction and is parallel to a plane defined by the first direction and a second direction;
   wherein for each layer of memory cells, the first layer of bit line material, the second layer of bit line material, the layer of semiconductor material, and the layer of resistivity switching material are stacked in a third direction that is substantially perpendicular to the plane defined by the first direction and the second direction;
   wherein for each layer of memory cells, the layer of resistivity switching material extends continuously in the second direction across an entire width of a respective memory cell; and
   wherein each of the one or more word line electrodes extends in the trench in the third direction.

12. The resistive memory array of claim 11, wherein for each layer of memory cells, the layer of semiconductor material extends continuously in the second direction across an entire width of a respective memory cell.

* * * * *